(12) United States Patent
Chikamori et al.

(10) Patent No.: US 9,685,566 B2
(45) Date of Patent: Jun. 20, 2017

(54) METHOD OF MANUFACTURING SILICON CARBIDE SEMICONDUCTOR DEVICE

(71) Applicants: Daisuke Chikamori, Tokyo (JP); Yasuhiko Nishio, Tokyo (JP); Naoki Yutani, Tokyo (JP)

(72) Inventors: Daisuke Chikamori, Tokyo (JP); Yasuhiko Nishio, Tokyo (JP); Naoki Yutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 19 days.

(21) Appl. No.: 13/673,349

(22) Filed: Nov. 9, 2012

(65) Prior Publication Data
US 2013/0196494 A1 Aug. 1, 2013

(30) Foreign Application Priority Data
Feb. 1, 2012 (JP) .................. 2012-019760

(51) Int. Cl.
*H01L 21/16* (2006.01)
*H01L 29/872* (2006.01)
(Continued)

(52) U.S. Cl.
CPC .......... *H01L 29/872* (2013.01); *C23C 14/185* (2013.01); *C23C 14/3492* (2013.01);
(Continued)

(58) Field of Classification Search
CPC ... H01L 29/872; H01L 29/6606; H01L 29/47; H01L 21/0495; H01L 29/1608;
(Continued)

(56) References Cited

U.S. PATENT DOCUMENTS 6,682,634 B1 1/2004 Kahn et al.
7,297,626 B1 * 11/2007 Cole et al. .................... 438/602
(Continued)

FOREIGN PATENT DOCUMENTS

CN 101916723 A 12/2010
EP 0789388 B1 10/2005
(Continued)

OTHER PUBLICATIONS

An Office Action; "Notification of Reason(s) for Refusal," issued by the Japanese Patent Office on Mar. 17, 2015, which corresponds to Japanese Patent Application No. 2012-019760 and is related to U.S. Appl. No. 13/673,349; with English language translation.
(Continued)

*Primary Examiner* — Julio J Maldonado
*Assistant Examiner* — Stanetta Isaac
(74) *Attorney, Agent, or Firm* — Studebaker & Brackett PC

(57) ABSTRACT

A target made of a metal material is sputtered to form a metal film on a silicon carbide wafer. At this time, the metal film is formed under a condition that an incident energy of incidence, on the silicon carbide wafer, of the metal material sputtered from the target and a sputtering gas flowed in through a gas inlet port is lower than a binding energy of silicon carbide, and more specifically lower than 4.8 eV. For example, the metal film is formed while a high-frequency voltage applied between a cathode and an anode is set to be equal to or higher than 20V and equal to or lower than 300V.

16 Claims, 8 Drawing Sheets

(51) Int. Cl.
*H01L 21/04* (2006.01)
*H01L 29/47* (2006.01)
*H01L 29/66* (2006.01)
*C23C 14/18* (2006.01)
*C23C 14/34* (2006.01)
*C23C 14/35* (2006.01)
*H01J 37/32* (2006.01)
*H01J 37/34* (2006.01)
*H01L 29/16* (2006.01)

(52) U.S. Cl.
CPC ........ *C23C 14/35* (2013.01); *H01J 37/32082* (2013.01); *H01J 37/34* (2013.01); *H01L 21/0495* (2013.01); *H01L 29/47* (2013.01); *H01L 29/6606* (2013.01); *H01L 29/1608* (2013.01)

(58) Field of Classification Search
CPC ........ H01L 21/28581; H01L 21/02167; H01L 21/02378; H01L 21/024; H01J 37/34; H01J 37/32082; C23C 14/3492; C23C 14/185; C23C 14/35
USPC ........................................................ 438/572
See application file for complete search history.

(56) References Cited

U.S. PATENT DOCUMENTS

| | | | |
|---|---|---|---|
| 7,656,010 B2 | 2/2010 | Murata et al. | |
| 7,859,087 B2 | 12/2010 | Murata et al. | |
| 2009/0057906 A1* | 3/2009 | Buchoff et al. | 257/754 |
| 2010/0193883 A1 | 8/2010 | Hase | |
| 2011/0256716 A1 | 10/2011 | Chiang et al. | |
| 2012/0111722 A1 | 5/2012 | Kodaira et al. | |
| 2014/0048413 A1 | 2/2014 | Kodaira et al. | |

FOREIGN PATENT DOCUMENTS

| | | |
|---|---|---|
| EP | 1078111 B1 | 12/2005 |
| JP | H04-154966 A | 5/1992 |
| JP | H04-225219 A | 8/1992 |
| JP | H07-157872 A | 6/1995 |
| JP | 09-129901 | 5/1997 |
| JP | H10-140344 A | 5/1998 |
| JP | 10-308358 | 11/1998 |
| JP | H10-294176 A | 11/1998 |
| JP | 2008-103705 A | 5/2008 |
| JP | 2008-210938 A | 9/2008 |
| JP | 2010-080965 A | 4/2010 |
| JP | 2010-182822 A | 8/2010 |
| WO | 2011/007832 A1 | 1/2011 |

OTHER PUBLICATIONS

The Second Office Action issued by the Chinese Patent Office on Oct. 8, 2015, which corresponds to Chinese Patent Application No. 201210522238.1 and is related to U.S. Appl. No. 13/673,349; with English language translation.

The First Office Action issued by the Chinese Patent Office on Apr. 3, 2015, which corresponds to Chinese Patent Application No. 201210522238.1 and is related to U.S. Appl. No. 13/673,349; with English language translation.

* cited by examiner

F I G. 1
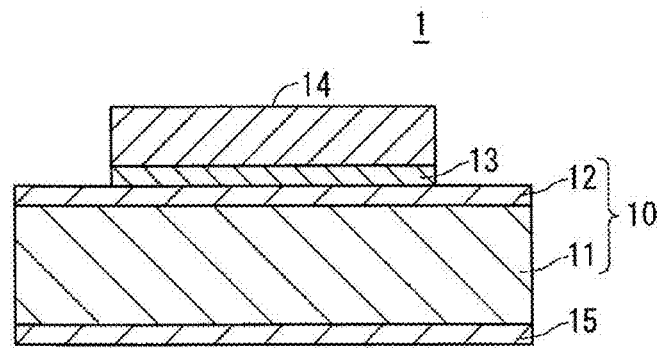
F I G. 2
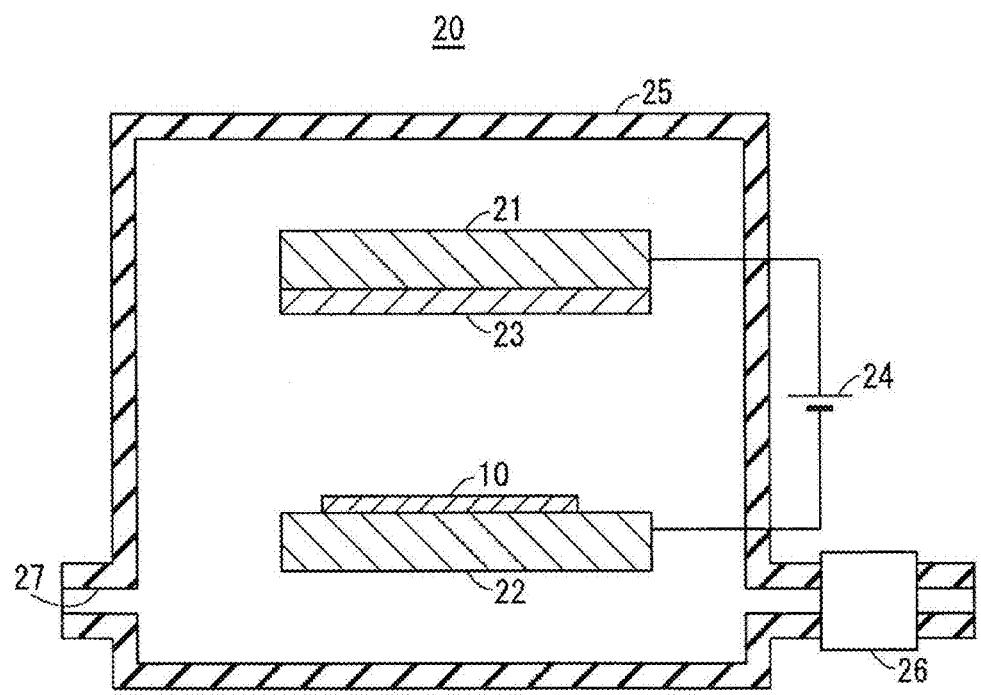

F I G . 6
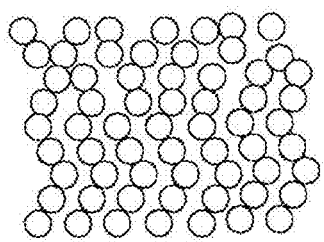
F I G . 7
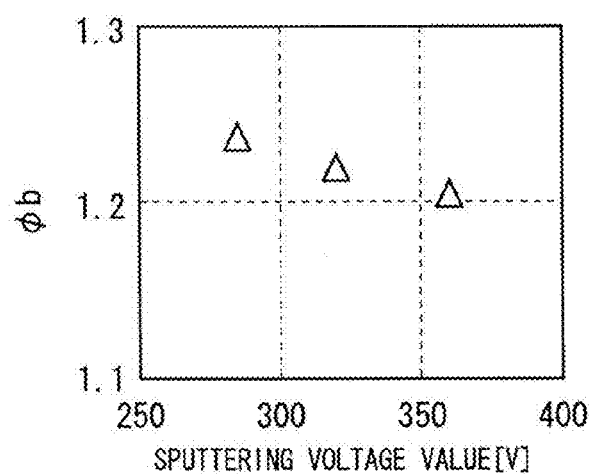
F I G . 8
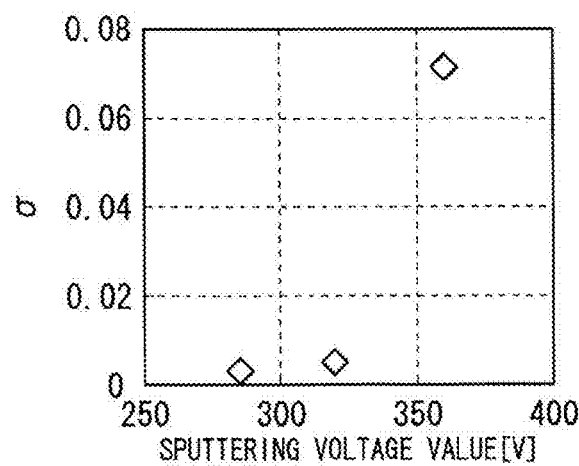

F I G . 1 1
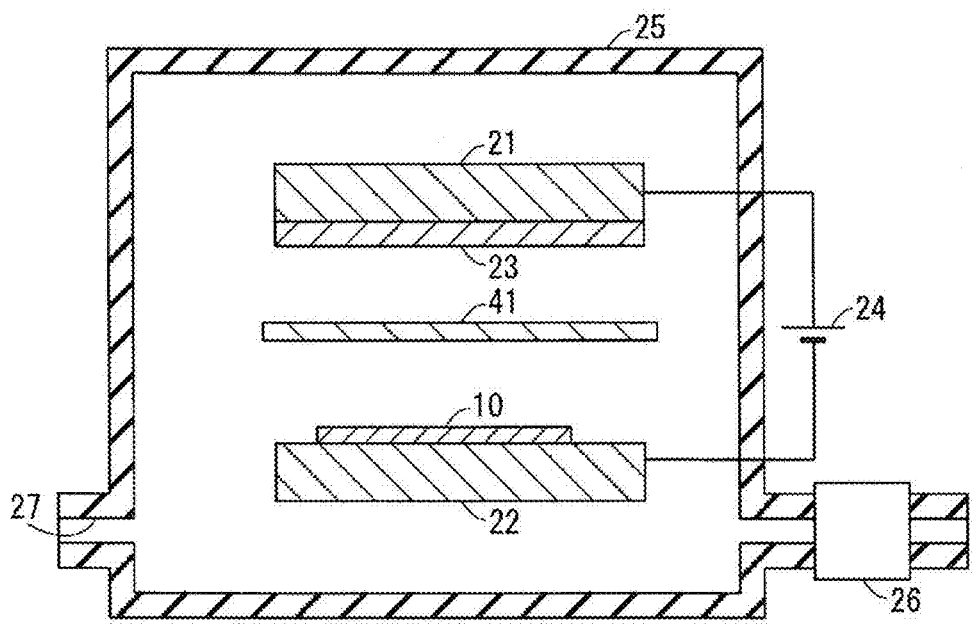
F I G . 1 2
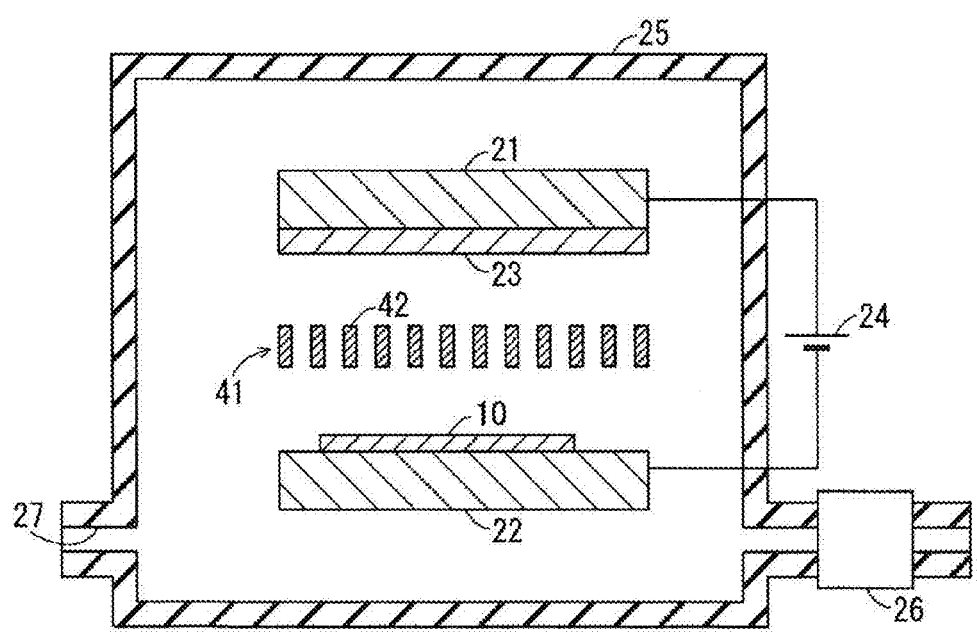

F I G . 1 7
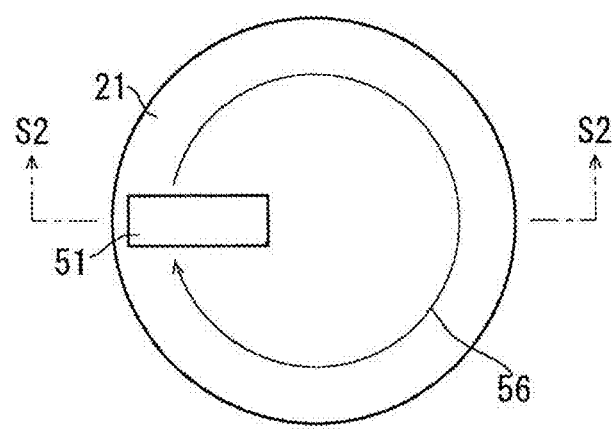

METHOD OF MANUFACTURING SILICON CARBIDE SEMICONDUCTOR DEVICE

BACKGROUND OF THE INVENTION

Field of the Invention

The present invention relates to a method of manufacturing a silicon carbide semiconductor device, and more specifically relates to a method of manufacturing a silicon carbide semiconductor device, such as a silicon carbide Schottky barrier diode, which uses a rectifying action of a Schottky barrier existing at a junction interface between a semiconductor and a metal.

Description of the Background Art

A diode is an electronic component that restricts a direction in which a current flows. The diode allows the current to flow in one direction, and prevent the current to flow in the opposite direction. Accordingly, the diode can be considered as an electronic version of a mechanical one-way valve. A circuit that requires a current to flow only in one direction includes one or more diodes.

A Schottky barrier diode (hereinafter, sometimes referred to as "Schottky diode") is a diode formed by contact between a semiconductor layer and a metal layer, which is different from a pn-junction diode formed by contact between two dissimilar semiconductor layers.

A silicon carbide (SiC) semiconductor is a Group IV-IV semiconductor which is very stable, and has a feature of a wider bandgap, a higher thermal conductivity, and a higher breakdown electric field than those of a silicon (Si) semiconductor. Therefore, a silicon carbide semiconductor device including SiC is operable under a high-temperature condition, and thus has been attracting attention as a high-power device with a high breakdown voltage and a low loss.

In preparation of a Schottky diode having a rectifying action obtained by a junction barrier of silicon carbide and a metal, a selection of a Schottky metal material and stabilization of reverse characteristics thereof are important factors. As a Schottky metal material, titanium (Ti), nickel (Ni), molybdenum (Mo), tungsten (W), or the like, is adopted.

In a case where a material causing a Schottky barrier is made a contact with a semiconductor, if a heat release is predominant, the current density J is represented by the following expression (1).

$$J = J0\{\exp(qV/kT) - 1\} \quad (1)$$

Here, J0 represents a saturation current density, q represents a charge amount, V represents an applied voltage, k represents Boltzmann's constant, and T represents the temperature. The saturation current density J0 is represented by the following expression (2).

$$J0 = A^* T^2 \exp\{-q(\phi b)/kT\} \quad (2)$$

Here, φb represents a Schottky barrier height, and A* represents Richardson's constant.

As apparent from the expression (2), as the Schottky barrier height φb increases, the saturation current density J0 decreases so that a reverse current can be suppressed.

However, in a conventional film formation method in Schottky junction between a Schottky metal layer and a silicon carbide substrate, an actual Schottky barrier height φb is lower than a theoretical Schottky barrier height φb due to an influence of damage to a junction interface, such as a disordered lattice, occurring in the process. For example, while the theoretical Schottky barrier height φb is 1.25 eV, the actual Schottky barrier height φb has a lower value of about 1.19 eV to 1.23 eV, and additionally has a variability in a wafer plane. There has been a problem that this variability causes a large variability between reverse current characteristics and forward current characteristics in the wafer plane and thus the reverse current characteristics and the forward current characteristics are not stabilized.

Techniques for suppressing damage to the junction interface occurring in the process are disclosed in, for example, Japanese Patent Application Laid-Open No. 10-308358 (1998) and Japanese Patent Application Laid-Open No. 2008-103705. In the technique disclosed in Japanese Patent Application Laid-Open No. 10-308358 (1998), to prevent entry of sputtering damage to a semiconductor layer, a metal film is vapor-deposited through a thermal vapor-deposition process, and then a metal film is formed thereon through a sputtering method (for example, see Japanese Patent Application Laid-Open No. 10-308358 (1998) (page 3)). In the technique disclosed in Japanese Patent Application Laid-Open No. 2008-103705, to reduce sputtering damage that occurs in causing a metal film to be deposited through a direct current (DC) sputtering method, DC power is controlled (for example, see Japanese Patent Application Laid-Open No. 2008-103705 (page 6)).

Additionally, Japanese Patent Application Laid-Open No. 9-129901 (1997) discloses a technique in which the Schottky barrier height is controlled by controlling the flatness of an interface between an electrode metal and a semiconductor. In the technique disclosed in Japanese Patent Application Laid-Open No. 9-129901 (1997), a process for flattening a surface of a semiconductor substrate is performed before the electrode metal is vapor-deposited (for example, see Japanese Patent Application Laid-Open No. 9-129901 (1997) (pages 7-8)).

Among device characteristics of a silicon carbide Schottky barrier diode, the reverse current characteristics and the breakdown voltage characteristics are greatly influenced by wafer defects, epitaxial layer defects, and process defects. Moreover, the forward current characteristics are greatly influenced by pretreatment conditions under which Schottky junction is formed and film formation conditions under which a Schottky metal film is formed.

As described above, in the method of manufacturing the silicon carbide semiconductor device according to the conventional techniques, there has been the problem that the Schottky barrier height φb has a variability in the wafer plane so that the reverse current characteristics and the forward current characteristics are not stabilized.

Techniques for solving such a problem include the techniques disclosed in Japanese Patent Application Laid-Open No. 10-308358 (1998), Japanese Patent Application Laid-Open No. 2008-103705, and Japanese Patent Application Laid-Open No. 9-129901 (1997), mentioned above. However, the technique disclosed in Japanese Patent Application Laid-Open No. 10-308358 (1998) is not a technique for improving the sputtering method itself. Therefore, even though the technique disclosed in Japanese Patent Application Laid-Open No. 10-308358 (1998) is used, damage occurring when a metal film is formed by the sputtering method cannot be reduced.

In the technique disclosed in Japanese Patent Application Laid-Open No. 2008-103705, the DC sputtering method is adopted. However, in the DC sputtering method, a plasma is formed near a specimen. Therefore, a silicon carbide wafer that is the specimen may be damaged.

The technique disclosed in Japanese Patent Application Laid-Open No. 9-129901 (1997) is a technique relating to a pretreatment performed prior to the formation of a metal film that will be an electrode, and not a technique relating to the formation of an electrode. Damage occurring when an electrode is formed by a sputtering method cannot be reduced by adoption of the technique disclosed in Japanese Patent Application Laid-Open No. 9-129901 (1997).

SUMMARY OF THE INVENTION

An object of the present invention is to provide a method of manufacturing a silicon carbide semiconductor device, that can suppress occurrence of damage at an interface between silicon carbide and a metal, which may be caused when a metal material is sputtered to form a metal film on a silicon carbide wafer, and thereby can stably manufacture a silicon carbide semiconductor device having a certain degree of electrical characteristics.

A method of manufacturing a silicon carbide semiconductor device according to the present invention includes a metal film formation step. The metal film formation step is performed as follows. In a chamber suctioned by a vacuum pump, a high-frequency voltage is applied between a pair of electrodes including an anode and a cathode arranged opposed to each other, to thereby cause a plasma of a sputtering gas to be generated between the pair of electrodes. A metal material placed on the cathode is sputtered with ions in the generated plasma. The sputtered metal material is deposited on a silicon carbide wafer that is placed on the anode so as to be opposed to the metal material. Thus, a metal film is formed.

In this step, the metal film is formed under a condition that an incident energy of incidence of the metal material and the sputtering gas on the silicon carbide wafer is lower than a binding energy of silicon carbide.

In the method of manufacturing a silicon carbide semiconductor device according to the present invention, the metal material is sputtered to form the metal film on the silicon carbide wafer under the condition that the incident energy of incidence of the metal material and the sputtering gas on the silicon carbide wafer is lower than the binding energy of silicon carbide. This can suppress damage to the silicon carbide wafer due to the metal material and the sputtering gas. Accordingly, damage occurring at an interface between silicon carbide and a metal is suppressed. Therefore, a silicon carbide semiconductor device having a certain degree of electrical characteristics can be stably manufactured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a configuration of a silicon carbide semiconductor device 1 according to a first preferred embodiment of the present invention;

FIG. 2 is a cross-sectional view showing a sputtering film formation apparatus 20 used in the first preferred embodiment of the present invention;

FIG. 6 is a diagram schematically showing a SiC lattice in a region B shown in FIG. 5;

FIG. 7 is a diagram showing one example of the relationship between a sputtering voltage and a Schottky barrier height φb;

FIG. 8 is a diagram showing one example of the relationship between the sputtering voltage and a variability σ of the Schottky barrier height φb;

FIG. 11 is a cross-sectional view showing a configuration of a sputtering film formation apparatus 40 used in a method of manufacturing a silicon carbide semiconductor device according to a fifth preferred embodiment of the present invention;

FIG. 12 is a cross-sectional view showing a configuration of the sputtering film formation apparatus 40 used in the method of manufacturing a silicon carbide semiconductor device according to the fifth preferred embodiment of the present invention;

FIG. 17 is a plan view showing a configuration of an electromagnet 51 shown in FIG. 16.

DESCRIPTION OF THE PREFERRED EMBODIMENTS

First Preferred Embodiment

Figure 3:
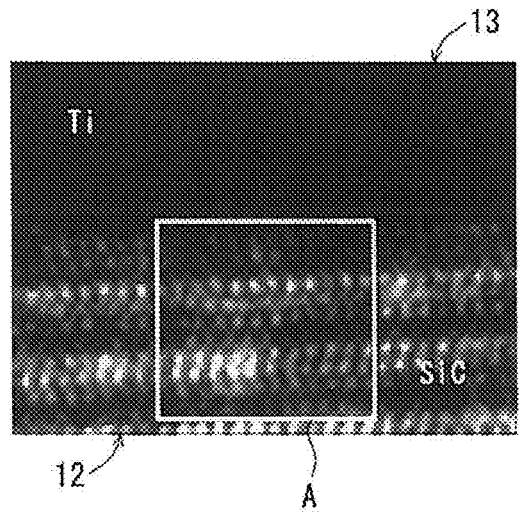
FIG. 3 is a diagram showing a TEM image obtained by observing, with a transmission electron microscope, a lattice at a Schottky interface formed in the first preferred embodiment of the present invention.

FIG. 1 is a cross-sectional view showing a configuration of a silicon carbide semiconductor device 1 according to a first preferred embodiment of the present invention. The silicon carbide semiconductor device 1 is manufactured by a method of manufacturing a silicon carbide semiconductor device according to the first preferred embodiment of the present invention. The silicon carbide semiconductor device 1 of this preferred embodiment is a Schottky barrier diode (Schottky Barrier Diode; abbreviated as SBD).

The silicon carbide semiconductor device 1 includes a silicon carbide substrate 11, an epitaxial layer 12, a metal layer 13, a surface electrode 14, and a back surface electrode 15. The silicon carbide substrate 11 and the epitaxial layer 12 form a silicon carbide wafer 10.

The silicon carbide substrate 11 is an n-type semiconductor substrate having the n-type conductivity. In this preferred embodiment, the silicon carbide substrate 11 is an n-type 4H-silicon carbide substrate having the 4H polytype.

The epitaxial layer 12 is provided on one surface of the silicon carbide substrate 11 with respect to the thickness direction thereof. More specifically, the epitaxial layer 12 is provided on a (0001) silicon face of the silicon carbide substrate 11 that is the n-type 4H-silicon carbide substrate. The epitaxial layer 12 has the n-type conductivity. The epitaxial layer 12 functions as a drift layer.

The metal layer 13 is provided on one surface of the epitaxial layer 12 with respect to the thickness direction thereof. In this preferred embodiment, the metal layer 13 is a Ti layer formed by forming a film of titanium (Ti) that is a Schottky metal using a sputtering film formation apparatus.

The surface electrode 14 is provided on one surface of the metal layer 13 with respect to the thickness direction thereof. The back surface electrode 15 is provided on the other surface of the silicon carbide substrate 11 with respect to the thickness direction thereof, that is, on the surface opposite to the surface having the epitaxial layer 12 provided thereon.

In the method of manufacturing a silicon carbide semiconductor device according to this preferred embodiment, the silicon carbide semiconductor device 1 is manufactured as follows. Firstly, the n-type epitaxial layer 12 serving as an n-type drift layer is epitaxially grown on one surface of the silicon carbide substrate 11 with respect to the thickness direction thereof, and more specifically, on a (0001) silicon face of the n-type 4H-silicon carbide substrate 11. Thus, the silicon carbide wafer 10 is obtained.

Then, the metal layer 13 is formed on one surface of the silicon carbide wafer 10 with respect to the thickness direction thereof, that is, on one surface of the epitaxial layer 12 with respect to the thickness direction thereof. In this preferred embodiment, a film of a Schottky metal material, which is a material of the metal layer 13, is formed by using a sputtering film formation apparatus, and thereby the metal layer 13 is formed. For example, titanium (Ti) is adopted as the Schottky metal material. For example, a sputtering film formation apparatus 20 shown in FIG. 2 is adopted as the sputtering film formation apparatus.

FIG. 2 is a cross-sectional view showing the sputtering film formation apparatus used in the first preferred embodiment of the present invention. The sputtering film formation apparatus 20 includes a the pair of electrodes 21 and 22, a power source 24, a chamber 25, and a vacuum pump 26. The pair of electrodes 21 and 22 include a cathode 21 and an anode 22. The cathode 21 and the anode 22 are arranged opposed to each other. A target 23 made of the Schottky metal material is set on the cathode 21. The silicon carbide wafer 10 that is a specimen is set on the anode 22 such that it is opposed to the target 23. The pair of electrodes 21 and 22, the target 23, and the silicon carbide wafer 10 are accommodated in the chamber 25.

In the sputtering film formation apparatus 20, the vacuum pump 26 suctions the chamber 25, and the power source 24 causes a high-frequency alternating current voltage (hereinafter referred to as "high-frequency voltage") to be applied between the pair of electrodes 21 and 22, and a sputtering gas is introduced through a gas inlet port 27. Thereby, plasma of the sputtering gas is generated between the pair of electrodes 21 and 22. Thus, the target 23 made of the Schottky metal material is sputtered by ions in the generated plasma. Ions of the target 23 (hereinafter, sometimes referred to as "film-forming material ion") that is a film-forming material thus sputtered is deposited on the silicon carbide wafer 10, to form a metal film which will be the metal layer 13. As the sputtering gas, for example, an inert gas of argon (Ar) is used.

When a film is formed by the sputtering film formation apparatus 20, it is necessary that an incident energy of incidence, on the silicon carbide wafer 10, of the film-forming material ion released from the target 23 as a result of the sputtering and of the sputtering gas such as an inert gas is lower than a binding energy of silicon carbide. To be specific, since the binding energy of silicon carbide is about 4.8 eV, it is necessary that the above-mentioned incident energy is lower than 4.8 eV.

To achieve this, in this preferred embodiment, an applied voltage (hereinafter, sometimes referred to as "sputtering voltage") that is applied between the cathode 21 and the anode 22 is set to be equal to or higher than a threshold value of an ion accelerating voltage for an emitting ion necessary for the sputtering and equal to or lower than a voltage at which no disordered lattice is observed in silicon carbide. A voltage value at which no disordered lattice is observed in silicon carbide is, specifically, 300V. For example, when Ar is used as the sputtering gas, a threshold value of the ion accelerating voltage for Ar that is the emitting ion necessary for the sputtering is 20V. Thus, the sputtering voltage is set to be equal to or higher than 20V and equal to or lower than 300V.

In this manner, setting the sputtering voltage to be equal to or higher than 20V and equal to or lower than 300V enables the incident energy of incidence, on the silicon carbide wafer 10, of the film-forming material ion and of the sputtering gas such as an inert gas to be lower than the binding energy of silicon carbide, and more specifically, to be lower than 4.8 eV.

This can cause the metal material that is the film-forming material ion and the sputtering gas such as an inert gas to be incident on the silicon carbide wafer 10 with low damage. In other words, damage to the silicon carbide wafer 10 caused by the metal material and the sputtering gas is suppressed. Accordingly, damage occurring in an interface between silicon carbide and a metal is suppressed. Therefore, the silicon carbide semiconductor device 1 having certain degree of electrical characteristics can be stably manufactured.

The metal layer 13 is formed in the above-described manner, and then the metal layer 13 is patterned into a desired device shape. Then, the surface electrode 14 is formed on one surface of the metal layer 13 with respect to the thickness direction thereof. Additionally, the back surface electrode 15 is formed on the other surface of the silicon carbide wafer 10 with respect to the thickness direction thereof, that is, on the other surface of the silicon carbide substrate 11 with respect to the thickness direction thereof. Thus, the silicon carbide semiconductor device 1 that is a Schottky barrier diode is obtained.

Figure 4:
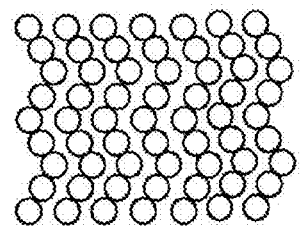
FIG. 4 is a diagram schematically showing a SiC lattice in a region A shown in FIG. 3.

FIG. 3 is a diagram showing a TEM image obtained by observing, with a transmission electron microscope (Transmission Electron Microscope; abbreviated as TEM), a lattice at a Schottky interface formed in the first preferred embodiment of the present invention. FIG. 3 shows a Schottky interface obtained when a Ti layer serving as the metal layer 13 is formed on the epitaxial layer 12 that is a SiC layer in accordance with the method of manufacturing a silicon carbide semiconductor device of this preferred embodiment under the condition that the sputtering voltage is set to be 300V or lower. The Schottky interface shown in FIG. 3 is an interface between the epitaxial layer 12 that is a SiC layer and the metal layer 13 that is a Ti layer. FIG. 4 is a diagram schematically showing a SiC lattice in a region A shown in FIG. 3.

Figure 5:
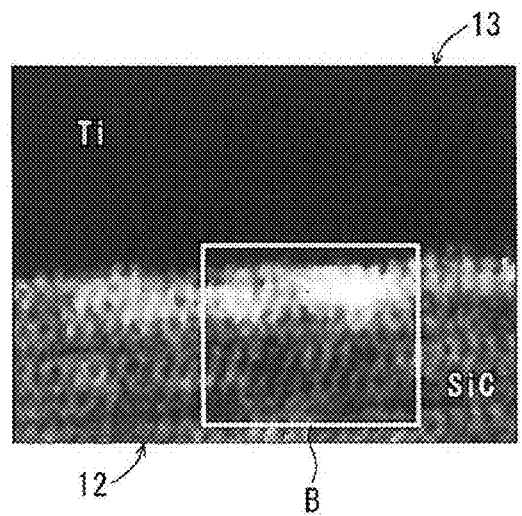
FIG. 5 is a diagram showing a TEM image of a lattice at a Schottky interface formed by a conventional method of manufacturing a silicon carbide semiconductor device.

FIG. 5 is a diagram showing a TEM image of a lattice at a Schottky interface formed by a conventional method of manufacturing a silicon carbide semiconductor device. FIG. 5 shows a Schottky interface obtained when a Ti layer serving as the metal layer 13 is formed on the epitaxial layer 12 that is a SiC layer under the condition that the sputtering voltage is 360V. FIG. 6 is a diagram schematically showing a SiC lattice in a region B shown in FIG. 5.

FIGS. 5 and 6 reveal that a disorder occurs in a lattice of the Schottky interface formed by the conventional method of manufacturing a silicon carbide semiconductor device. On the other hand, in this preferred embodiment shown in FIGS. 3 and 4, no disorder occurs in a lattice of the interface.

This indicates that, in the silicon carbide semiconductor device 1 that is a Schottky barrier diode manufactured by the method of manufacturing a silicon carbide semiconductor device according to this preferred embodiment, an ideal Schottky interface is formed in which a disordered lattice is reduced at the interface between the epitaxial layer 12 that is a SiC layer and the metal layer 13 that is a Schottky barrier electrode.

FIG. 7 is a diagram showing one example of the relationship between the sputtering voltage and a Schottky barrier height φb. In FIG. 7, the horizontal axis represents the sputtering voltage value [V] and the vertical axis represents the Schottky barrier height φb. From FIG. 7, it is found that the Schottky barrier height φb decreases as the sputtering voltage increases.

FIG. 8 is a diagram showing one example of the relationship between the sputtering voltage and a variability a of the Schottky barrier height φb. In FIG. 8, the horizontal axis represents the sputtering voltage value [V] and the vertical axis represents the variability σ of the Schottky barrier height φb. From FIG. 8, it is found that lowering the sputtering voltage reduces the variability a of the Schottky barrier height φb.

Figure 9:
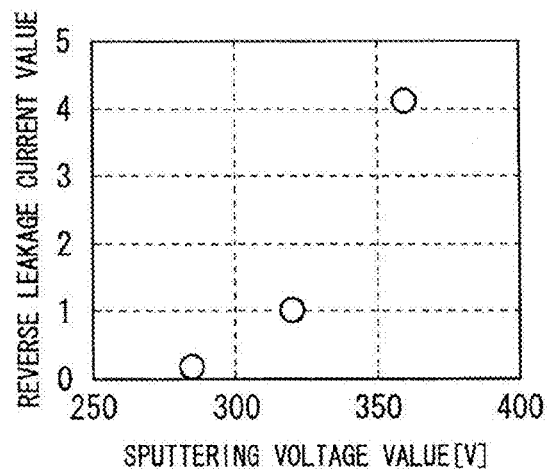
FIG. 9 is a diagram showing one example of the relationship between a reverse leakage current value of a Schottky barrier diode and the sputtering voltage.

FIG. 9 is a diagram showing one example of the relationship between a reverse leakage current value of the Schottky barrier diode and the sputtering voltage. In FIG. 9, the horizontal axis represents the sputtering voltage value [V] and the vertical axis represents a reverse leakage current value [A]. From FIG. 9, it is found that the reverse leakage current value increases as the sputtering voltage increases.

From the above-described results, when a film of the metal layer 13 made of a Schottky metal is formed while the sputtering voltage is set to be equal to or higher than 20V and equal to or lower than 300V as in the method of manufacturing a silicon carbide semiconductor device according to this preferred embodiment, the Schottky barrier height φb can be increased, as compared with the conventional technique in which the sputtering voltage is set to be 360V for example. Additionally, the variability σ of the Schottky barrier height φb can be reduced. Accordingly, a Schottky barrier diode having uniform forward current characteristics and reverse current characteristics can be provided.

In this preferred embodiment, the sputtering voltage is set to be equal to or higher than 20V and equal to or lower than 300V, and thereby the incident energy of incidence of the metal material and the sputtering gas on the silicon carbide wafer 10 is made lower than the binding energy of silicon carbide. However, a method for making the incident energy lower than the binding energy of silicon carbide is not limited thereto.

For example, it may be possible to form the metal film serving as the metal layer 13 while making the incident energy lower than the binding energy of silicon carbide by setting the distance between the pair of electrodes 21 and 22 to be equal to or larger than 10 cm, that is, 0.1 m. This also exerts the same effects as those of this preferred embodiment.

Alternatively, for example, it may be possible to form the metal film serving as the metal layer 13 while making the incident energy lower than the binding energy of silicon carbide by setting the flow rate of the sputtering gas to be lower than 10 sccm. This exerts the same effects as those of this preferred embodiment. Here, the unit "sccm" means the flow rate (cc) per minute (min) at 0° C. and 1 atmosphere (atm), and 1 sccm=1.69×10$^{-4}$ Pa·m$^3$/sec.

Second Preferred Embodiment

In a method of manufacturing a silicon carbide semiconductor device according to a second preferred embodiment of the present invention, the metal layer 13 is formed in the same manner as the first preferred embodiment, and then a heat treatment is performed at a crystal recovery temperature that is a temperature near a recrystallization temperature at which the Schottky metal material of the metal layer 13 is recrystallized. Hereinafter, this heat treatment may be sometimes referred to as "recrystallization heat treatment". Performing the recrystallization heat treatment can promote the recovery from crystal defects in the metal layer 13. The crystal recovery temperature is, for example, the recrystallization temperature ±50° C.

For example, in a case of manufacturing a silicon carbide semiconductor device having a Ti/n-type silicon carbide Schottky junction including the metal layer 13 made of Ti, a Ti film is formed under the same process conditions as the first preferred embodiment described above, and then the recrystallization heat treatment is performed in which a heat treatment is performed at 450° C.±50° C., which is a temperature near the recrystallization temperature at which Ti is recrystallized. Thereby, the recovery from crystal defects in the Ti film is promoted.

In a step subsequent to the recrystallization heat treatment, the heat treatment temperature in a heat treatment, such as a polyimide baking process performed for device protection, is set to be lower than the heat treatment temperature in the recrystallization heat treatment by 50° C. or more. This prevents the crystal of the metal layer 13, which has been stabilized in the recrystallization heat treatment, from becoming unstable again.

For example, in a case of manufacturing a silicon carbide semiconductor device having the Ti/n-type silicon carbide Schottky junction mentioned above, the heat treatment temperature performed in the step subsequent to the recrystallization heat treatment is set to be lower, by 50° C. or more, than the heat treatment temperature in the crystal defect recovery process for the recovery from crystal defects in the Ti film. This prevents the crystal of the Ti film stabilized in the recrystallization heat treatment from becoming unstable again.

As described above, in the method of manufacturing a silicon carbide semiconductor device according to this preferred embodiment, after the metal layer 13 is formed, the recrystallization heat treatment is performed at a temperature near the recrystallization temperature at which the metal layer 13 is recrystallized, to thereby promote the recovery from crystal defects in the metal layer 13. This can further reduce the variability of the Schottky barrier height φb as compared with the first preferred embodiment. Thus, a silicon carbide semiconductor device that is a Schottky barrier diode having further uniform forward current characteristics and reverse current characteristics is obtained.

Third Preferred Embodiment

In the method of manufacturing a silicon carbide semiconductor device according to the first preferred embodiment described above, the Schottky metal film is formed at a reduced speed, because the sputtering voltage is set to be equal to or higher than 20V and equal to or lower than 300V until the metal layer 13 made of the Schottky metal is entirely formed. Accordingly, it takes time to form the metal layer 13 having a desired film thickness, which results in poor productivity.

Therefore, in a method of manufacturing a silicon carbide semiconductor device according to a third preferred embodiment of the present invention, the metal film serving as the metal layer 13 is formed while the high-frequency voltage applied between the pair of electrodes 21 and 22 is set to be equal to or higher than 20V and equal to or lower than 300V until a predefined low-voltage film formation period elapses from a time point (hereinafter, sometimes referred to as "plasma ignition time") at which the plasma is ignited to the sputtering gas. After the low-voltage film formation period elapses, the high-frequency voltage applied between the pair of electrodes 21 and 22 is increased to above 300V, and thus the metal film serving as the metal layer 13 is formed.

That is, in this preferred embodiment, a portion of the metal layer 13 corresponding to about 10 nm, which influences the Schottky interface, is formed while the sputtering voltage is set to be equal to or higher than 20V and equal to or lower than 300V, and then the sputtering voltage is increased to above 300V and the rest of the metal layer 13 is formed. This can increase the film formation speed, to shorten the time required for forming a film having a desired film thickness, thus improving the productivity.

The above-mentioned low-voltage film formation period is, for example, 10 seconds. Since the low-voltage film formation period is set to be 10 seconds, as described above, a portion of the metal layer 13 corresponding to about 10 nm, which influences the Schottky interface, can be formed under the condition that the sputtering voltage is set to be equal to or higher than 20V and equal to or lower than 300V.

In this preferred embodiment, the sputtering voltage is set to be equal to or higher than 20V and equal to or lower than 300V, and thereby the incident energy of incidence of the metal material and the sputtering gas on the silicon carbide wafer 10 is made lower than the binding energy of silicon carbide. However, a method for making the incident energy lower than the binding energy of silicon carbide is not limited thereto.

For example, as described above, it may be possible to form the metal film serving as the metal layer 13 while making the incident energy lower than the binding energy of silicon carbide by setting the distance between the pair of electrodes 21 and 22 to be equal to or larger than 10 cm, that is, 0.1 m.

In this case, until a predefined long-distance film formation period elapses from the plasma ignition time, the metal film is formed while the distance between the pair of electrodes 21 and 22 is set to be equal to or larger than 0.1 m. After the long-distance film formation period elapses, the metal film is formed while the distance between the pair of electrodes 21 and 22 is set to be less than 0.1 m. This exerts the same effects as those of this preferred embodiment.

The long-distance film formation period may be similar to the low-voltage film formation period mentioned above, and is 10 seconds, for example. Since the long-distance film formation period is set to be 10 seconds, as described above, a portion of the metal layer 13 corresponding to about 10 nm, which influences the Schottky interface, can be formed under the condition that the distance between the pair of electrodes 21 and 22 is set to be equal to or larger than 0.1 m.

Alternatively, for example, as described above, it may be possible to form the metal film serving as the metal layer 13 while making the incident energy lower than the binding energy of silicon carbide by setting the flow rate of the sputtering gas to be lower than 10 sccm. In this case, until a predefined low-flow-rate film formation period elapses from the plasma ignition time, the metal film is formed while the flow rate of the sputtering gas is set to be lower than 10 sccm. After the low-flow-rate film formation period elapses, the flow rate of the sputtering gas is set to be equal to or higher than 10 sccm, and the metal film is formed. This exerts the same effects as those of this preferred embodiment.

The low-flow-rate film formation period may be similar to the low-voltage film formation period and the long-distance film formation period mentioned above, and is 10 seconds, for example. Since the low-flow-rate film formation period is set to be 10 seconds, as described above, a portion of the metal layer 13 corresponding to about 10 nm, which influences the Schottky interface, can be formed under the condition that the flow rate of the sputtering gas is set to be lower than 10 sccm.

Fourth Preferred Embodiment

Figure 10:
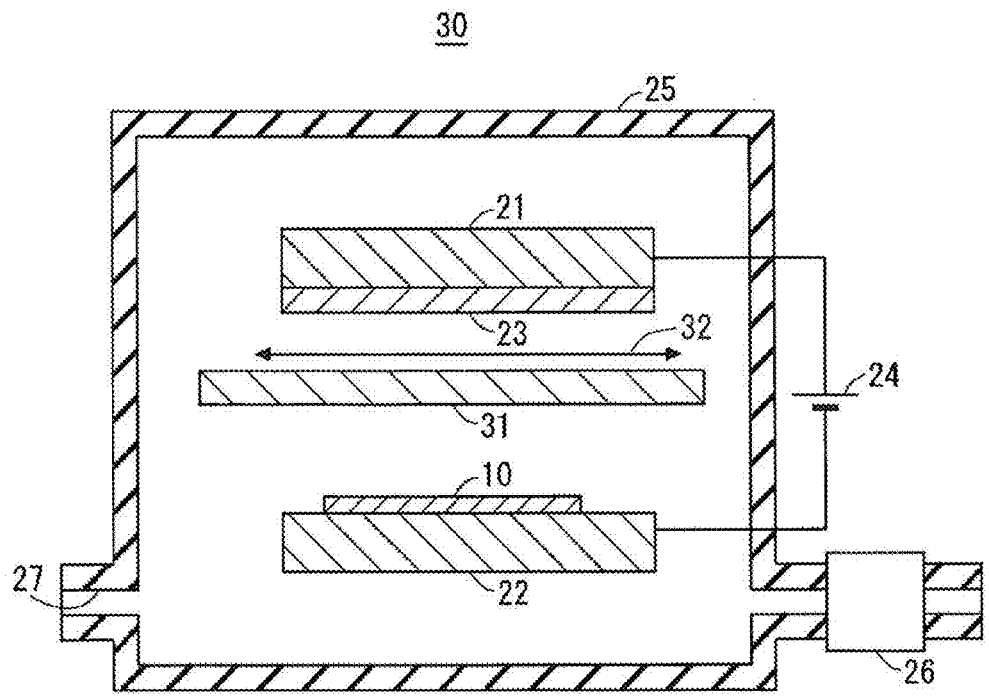
FIG. 10 is a cross-sectional view showing a configuration of a sputtering film formation apparatus 30 used in a method of manufacturing a silicon carbide semiconductor device according to a fourth preferred embodiment of the present invention.

FIG. 10 is a cross-sectional view showing a configuration of a sputtering film formation apparatus 30 used in a method of manufacturing a silicon carbide semiconductor device according to a fourth preferred embodiment of the present invention. In the method of manufacturing a silicon carbide semiconductor device according to the fourth preferred embodiment of the present invention, the metal layer 13 is formed by using the sputtering film formation apparatus 30 shown in FIG. 10. The sputtering film formation apparatus 30 is similar to the sputtering film formation apparatus 20 shown in FIG. 2 that is used in the first preferred embodiment described above. Therefore, the same parts of the configurations are denoted by the same reference numerals, and descriptions thereof are omitted.

The sputtering film formation apparatus 30 used in this preferred embodiment includes a shutter 31 in addition to the configuration of the sputtering film formation apparatus 20 shown in FIG. 2 used in the first preferred embodiment described above. The shutter 31 is arranged to be displaceable in a direction indicated by the arrow 32 that is perpendicular to the thickness direction of the cathode 21 and the anode 22.

The shutter 31 is arranged such that it displaces in the direction indicated by the arrow 32 and thereby can switch between an open state and a closed state. In the open state, a path between the cathode 21 and the anode 22 is opened. In the closed state, the path is closed. In the closed state, the shutter 31 is interposed between the cathode 21 and the anode 22, while in the open state, the shutter 31 is located at a position retracted from a space between the cathode 21 and the anode 22. In the closed state, the silicon carbide wafer 10 is covered with the shutter 31. Thus, the closed state is a state where the shutter 31 is placed between the pair of electrodes 21 and 22 such that it covers the silicon carbide wafer 10, and the open state is a state where the shutter 31 is retracted from a position at which it covers the silicon carbide wafer 10.

At the plasma ignition time of the sputtering film formation apparatus 30, a high voltage occurs between the pair of electrodes 21 and 22, and the silicon carbide wafer 10 may be damaged by the film-forming material ion and the sputtering gas being accelerated by this high voltage.

To avoid such damage, in this preferred embodiment, at the plasma ignition time of the sputtering film formation apparatus 30, as shown in FIG. 10, the shutter 31 is brought into the closed state to protect the silicon carbide wafer 10 with the shutter 31. In this manner, while the shutter 31 is in the closed state, the plasma is ignited to the sputtering gas.

Then, after the sputtering voltage between the electrodes 21 and 22 is stabilized at 300V or less, the shutter 31 is opened into the open state, and the formation of the metal film serving as the metal layer 13 on the silicon carbide wafer 10 is started. More specifically, after a predefined closing period elapses from the plasma ignition time, the shutter 31 is opened into the open state and the formation of the metal film is started.

This can further reduce damage to the silicon carbide wafer 10, as compared with the first and second preferred embodiments. Accordingly, a silicon carbide semiconductor device that is a Schottky barrier diode having further uniform forward current characteristics and reverse current characteristics is obtained.

The closing period mentioned above is, for example, 10 seconds. After 10 seconds elapse from the plasma ignition time, the sputtering voltage is stabilized at 300V or less. Therefore, setting the closing period to be 10 seconds can achieve reduction in damage to the silicon carbide wafer 10.

Fifth Preferred Embodiment

FIGS. 11 and 12 are cross-sectional views showing a configuration of a sputtering film formation apparatus 40 used in a method of manufacturing a silicon carbide semiconductor device according to a fifth preferred embodiment of the present invention. In the silicon carbide semiconductor device according to the fifth preferred embodiment of the present invention, the metal layer 13 is formed by using the sputtering film formation apparatus 40 shown in FIGS. 11 and 12. The sputtering film formation apparatus 40 is similar to the sputtering film formation apparatus 20 shown in FIG. 2 that is used in the first preferred embodiment described above. Therefore, the same parts of the configurations are denoted by the same reference numerals, and descriptions thereof are omitted.

The sputtering film formation apparatus 40 used in this preferred embodiment includes a variable angle collimator 41 in addition to the configuration of the sputtering film formation apparatus 20 shown in FIG. 2 used in the first preferred embodiment described above. As shown in FIG. 12, the variable angle collimator 41 includes a plurality of regulating plates 42. Each of the regulating plates 42 regulates a radiation direction of the film-forming material ion and the sputtering gas. The variable angle collimator 41 is configured to vary the angle of each regulating plate 42 relative to a line (hereinafter referred to as "reference line") connecting the cathode 21 and the anode 22 to each other. In this preferred embodiment, the cathode 21 and the anode 22 are shaped into flat plates and arranged in parallel with each other, and therefore the reference line is a line that is parallel to the thickness direction of the cathode 21 and the anode 22 and perpendicular to the cathode 21 and the anode 22.

Figure 13:
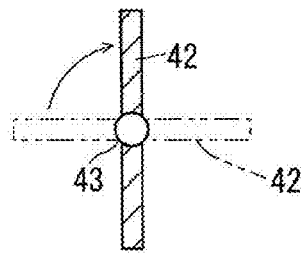
FIG. 13 is an enlarged cross-sectional view of a regulating plate 42.

FIG. 13 is an enlarged cross-sectional view of the regulating plate 42. The regulating plate 42 is rotatable around a support shaft 43. The regulating plate 42 can vary its angle relative to the reference line by rotating around the support shaft 43. In FIG. 13, the regulating plate 42 in a state where the angle thereof relative to the reference line is 0° is illustrated with the solid line, and the regulating plate 42 in a state where the angle thereof relative to the reference line is 90° is illustrated with the alternate long and two short dashes line.

FIG. 11 corresponds to the state where the angle of the regulating plate 42 relative to the reference line is 90°, and FIG. 12 corresponds to the state where the angle of the regulating plate 42 relative to the reference line is 0°. In FIG. 11, for facilitation of understanding, the plurality of regulating plates 42 are collectively shown as a single plate.

As shown in FIG. 11, when the angle of the regulating plates 42 relative to the reference line is 90°, the plurality of regulating plates 42 included in the variable angle collimator 41 are aligned substantially in a straight line, to close the path extending from the cathode 21 to the anode 22. As shown in FIG. 12, when the angle of the regulating plates 42 relative to the reference line is 0°, the path extending from the cathode 21 to the anode 22 is opened.

That is, the variable angle collimator 41 has the same function as that of the shutter 31 of the sputtering film formation apparatus 30 used in the fourth preferred embodiment described above. The state where the angle of the regulating plates 42 relative to the reference line is 0° corresponds to the open state, and the state where the angle of the regulating plates 42 relative to the reference line is 90° corresponds to the closed state.

In this preferred embodiment, similarly to the fourth preferred embodiment described above, at the plasma ignition time of the sputtering film formation apparatus 40, the variable angle collimator 41 is brought into a closed state where the angle of the regulating plates 42 relative to the reference line is 90' as shown in FIG. 11, to protect the silicon carbide wafer 10 with the variable angle collimator 41. In this manner, while the regulating plates 42 are inclined with respect to the reference line so that the angle of the regulating plates 42 relative to the reference line is 90°, the plasma is ignited to the sputtering gas.

Then, after the sputtering voltage between the electrodes 21 and 22 is stabilized at 300V or less, the angle of the regulating plates 42 relative to the reference line is set to be equal to or more than 0° and less than 90°, and in this preferred embodiment, set to be 0° to brought the variable angle collimator 41 into the open state, and the formation of the metal layer 13 on the silicon carbide wafer 10 is started.

Figure 14:
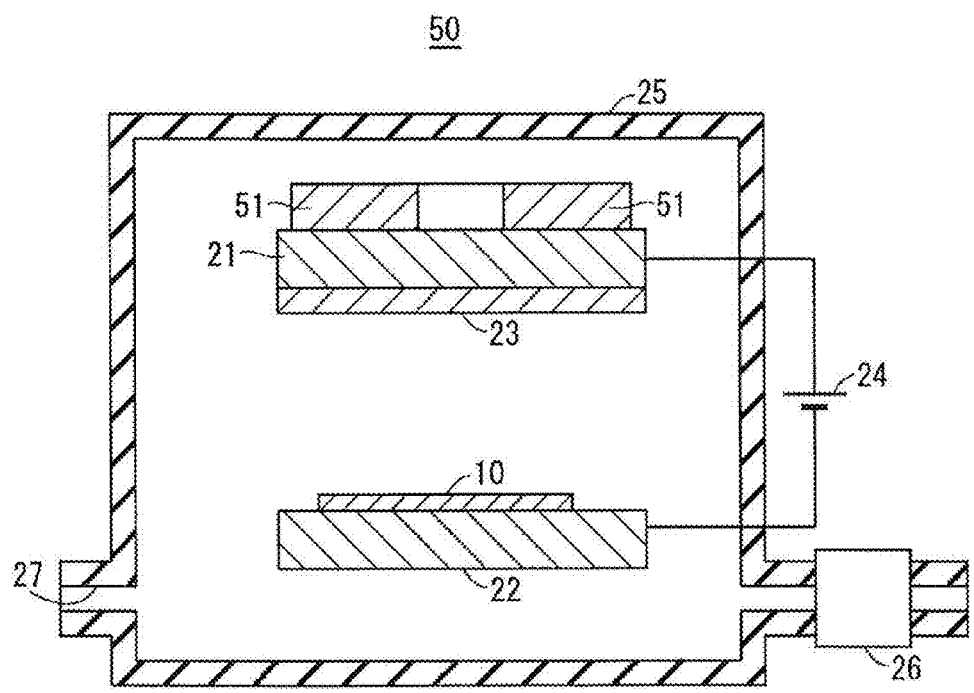
FIG. 14 is a cross-sectional view showing a configuration of a sputtering film formation apparatus 50 used in a method of manufacturing a silicon carbide semiconductor device according to a sixth preferred embodiment of the present invention.

This exerts the same effects as those of the fourth preferred embodiment. To be specific, as compared with the first and second preferred embodiments, damage to the silicon carbide wafer 10 can be further reduced. Accordingly, a silicon carbide semiconductor device that is a Schottky barrier diode having further uniform forward current characteristics and reverse current characteristics is obtained Sixth Preferred Embodiment FIG. 14 is a cross-sectional view showing a configuration of a sputtering film formation apparatus 50 used in a method of manufacturing a silicon carbide semiconductor device according to a sixth preferred embodiment of the present invention. In the method of manufacturing a silicon carbide semiconductor device according to the sixth preferred embodiment of the present invention, the metal layer 13 is formed by using the sputtering film formation apparatus 50 shown in FIG. 14. The sputtering film formation apparatus 50 is similar to the sputtering film formation apparatus 20 shown in FIG. 2 that is used in the first preferred embodiment described above. Therefore, the same parts of the configurations are denoted by the same reference numerals, and descriptions thereof are omitted.

Figure 15:
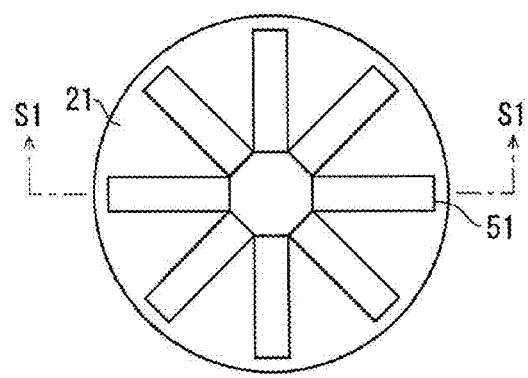
FIG. 15 is a plan view showing a configuration of an electromagnet 51 shown in FIG. 14.

The sputtering film formation apparatus 50 used in this preferred embodiment includes an electromagnet 51 in addition to the configuration of the sputtering film formation apparatus 20 shown in FIG. 2 used in the first preferred embodiment described above. FIG. 15 is a plan view showing a configuration of the electromagnet 51 shown in FIG. 14. In FIG. 15, for facilitation of understanding, among parts of the sputtering film formation apparatus 50 shown in FIG. 14, only the cathode 21 and the electromagnet 51 are shown. A cross-sectional configuration shown in FIG. 14 corresponds to a cross-sectional configuration taken along the line S1-S1 indicated in FIG. 15.

In the sputtering film formation apparatus 50, a plurality of the electromagnets 51 are provided on a surface of the cathode 21 opposite to the surface thereof having the target 23 set thereon, that is, opposite to the surface facing the anode 22. Each of the electromagnets 51 has a bar shape, and arranged with one end portion thereof directed toward a central portion of the cathode 21 having a circular plate shape and the other end portion thereof directed toward an outer circumferential edge of the cathode 21. In other words, the plurality of electromagnets 51 are arranged radially from the central portion of the cathode 21.

In the sputtering film formation apparatus 50, a film can be formed in a state where a magnetic field is generated around the cathode 21 by a current being flowed through the electromagnets 51. Forming a film in such a manner enables generation of the plasma of the sputtering gas to be concentrated around the cathode 21, and therefore the target 23 set on the cathode 21 can be intensively sputtered. This prevents the plasma of the sputtering gas to be formed near the silicon carbide wafer 10 that is a specimen, and thus suppresses damage to the silicon carbide wafer 10.

In the sputtering film formation apparatus 50 used in this preferred embodiment, at the plasma ignition time, the film-forming material ion and the sputtering gas such as an inert gas may be locally concentrated. To avoid this, this preferred embodiment is configured as follows.

At the plasma ignition time of the sputtering film formation apparatus 50, inflow of the current to the electromagnets 51 mounted on the cathode 21 is stopped so that no magnetic field is generated by the electromagnets 51. In this manner, the plasma is ignited to the sputtering gas in a state where magnetic force of the electromagnets 51 is deactivated.

Then, after the sputtering voltage between the electrodes 21 and 22 is stabilized at 300V or less, the current is sequentially flowed through the plurality of electromagnets 51, and the formation of the metal film serving as the metal layer 13 on the silicon carbide wafer 10 is started. More specifically, after a predefined demagnetizing period elapses from the plasma ignition time, the current is sequentially flowed through the plurality of electromagnets 51 to cause the magnetic force, and the formation of the metal film is started.

This can further reduce damage to the silicon carbide wafer 10. Accordingly, a silicon carbide semiconductor device that is a Schottky barrier diode having further uniform forward current characteristics and reverse current characteristics is obtained.

The demagnetizing period mentioned above is, for example, 10 seconds. After seconds elapse from the plasma ignition time, the sputtering voltage is stabilized at 300V or less. Therefore, setting the demagnetizing period to be 10 seconds can achieve reduction in damage to the silicon carbide wafer 10.

Seventh Preferred Embodiment

Figure 16:
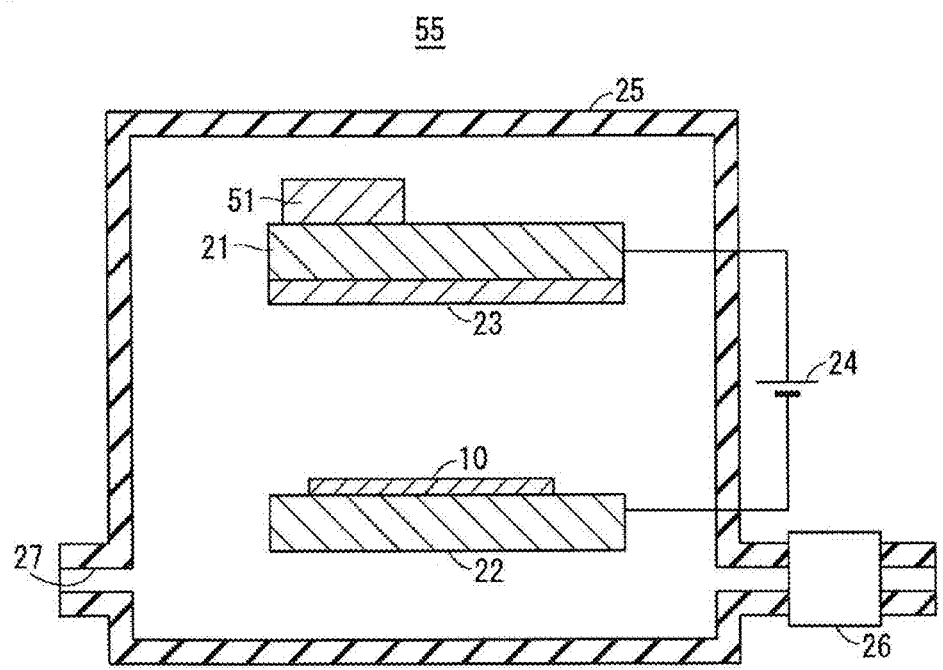
FIG. 16 is a cross-sectional view showing a configuration of a sputtering film formation apparatus 55 used in a method of manufacturing a silicon carbide semiconductor device according to a seventh preferred embodiment of the present invention.

FIG. 16 is a cross-sectional view showing a configuration of a sputtering film formation apparatus 55 used in a method of manufacturing a silicon carbide semiconductor device according to a seventh preferred embodiment of the present invention. In the method of manufacturing a silicon carbide semiconductor device according to the seventh preferred embodiment of the present invention, the metal layer 13 is formed by using the sputtering film formation apparatus 55 shown in FIG. 16. The sputtering film formation apparatus 55 is similar to the sputtering film formation apparatus 50 shown in FIG. 14 that is used in the sixth preferred embodiment described above. Therefore, the same parts of the configurations are denoted by the same reference numerals, and descriptions thereof are omitted.

The sputtering film formation apparatus 55 used in this preferred embodiment is the same as the sputtering film formation apparatus 50 shown in FIG. 14 used in the sixth preferred embodiment described above, except that one electromagnet 51 is provided instead of the plurality of electromagnets 51. FIG. 17 is a plan view showing a configuration of the electromagnet 51 shown in FIG. 16. In FIG. 17, for facilitation of understanding, among parts of the sputtering film formation apparatus 55 shown in FIG. 16, only the cathode 21 and the electromagnet 51 are shown. A cross-sectional configuration shown in FIG. 16 corresponds to a cross-sectional configuration taken along the line S2-S2 indicated in FIG. 17.

The electromagnet 51 of this preferred embodiment is, similarly to the electromagnets 51 of the sixth preferred embodiment, provided on a surface of the cathode 21 opposite to the surface thereof having the target 23 set thereon, that is, opposite to the surface facing the anode 22. The electromagnet 51 has a bar shape, and arranged with one end portion thereof directed toward a central portion of the cathode 21 having a circular plate shape and the other end portion thereof directed toward an outer circumferential edge of the cathode 21.

In this preferred embodiment, the electromagnet 51 is arranged rotatably in a circumferential direction of the cathode 21 as indicated by an arrow 56 with an axis line of rotation being placed at the center of a circle that defines the cathode 21. In the sputtering film formation apparatus 55, a film can be formed in a state where a magnetic field is generated around the cathode 21 by a current being flowed through the electromagnet 51 while the electromagnet 51 is rotated in the direction of the arrow 56.

Similarly to the sixth preferred embodiment described above, forming a film in such a manner enables generation of the plasma of the sputtering gas to be concentrated around the cathode 21, and therefore the target 23 set on the cathode 21 can be intensively sputtered. This prevents the plasma of the sputtering gas to be formed near the silicon carbide wafer 10 that is a specimen, and thus suppresses damage to the silicon carbide wafer 10.

In the sputtering film formation apparatus 55 used in this preferred embodiment, similarly to the sputtering film formation apparatus 50 used in the sixth preferred embodiment described above, the film-forming material ion and the sputtering gas such as an inert gas may be concentrated at the plasma ignition time. To avoid this, this preferred embodiment is configured as follows.

At the plasma ignition time of the sputtering film formation apparatus 55, inflow of the current to the electromagnet 51 mounted on the cathode 21 is stopped and rotation of the electromagnet 51 is stopped, so that no magnetic field is generated by the electromagnet 51. In this manner, the plasma is ignited to the sputtering gas in a state where magnetic force of the electromagnet 51 is deactivated.

Then, after the sputtering voltage between the electrodes 21 and 22 is stabilized at 300V or less, the current is flowed through the electromagnet 51 while the electromagnet 51 is rotated in the direction of the arrow 56, and the formation of the metal film serving as the metal layer 13 on the silicon carbide wafer 10 is started. More specifically, after the predefined demagnetizing period elapses from the plasma ignition time, the current is flowed through the electromagnet 51 to cause the magnetic force while the electromagnet 51 is rotated, and the formation of the metal film is started.

This exerts the same effects as those of the sixth preferred embodiment. To be specific, damage to the silicon carbide wafer 10 can be further reduced. Accordingly, a silicon carbide semiconductor device that is a Schottky barrier diode having further uniform forward current characteristics and reverse current characteristics is obtained.

Similarly to the sixth preferred embodiment described above, the demagnetizing period mentioned above is, for example, 10 seconds. As described above, after 10 seconds elapse from the plasma ignition time, the sputtering voltage is stabilized at 300V or less. Therefore, setting the demagnetizing period to be 10 seconds can achieve reduction in damage to the silicon carbide wafer 10.

In the cases shown in the preferred embodiments described above, the metal film serving as the metal layer 13 is formed on a single silicon carbide wafer 10 by using any of the sputtering film formation apparatuses 20, 30, 40, 50, and 55. However, this is not limiting, and it may be acceptable that metal films serving as the metal layers 13 are sequentially formed on a plurality of silicon carbide wafers 10.

In this case, for example, similarly to the first preferred embodiment described above, the high-frequency voltage applied between the pair of electrodes 21 and 22 is set to be equal to or higher than 20V and equal to or lower than 300V, and the metal films are sequentially formed on the plurality of silicon carbide wafers 10. Among the plurality of silicon carbide wafers 10 on which the metal films have been formed, the first one of the silicon carbide wafers 10 on which the metal film has been firstly formed is excluded, and the second and subsequent one of the silicon carbide wafers 10 on which the metal films have been secondly and subsequently formed are used to manufacture the silicon carbide semiconductor devices 1. That is, the first silicon carbide wafer 10 is used as a dummy, and the silicon carbide wafers 10 that will be products are processed secondly and subsequently.

Accordingly, at the plasma ignition time in which damage is likely to occur, the dummy silicon carbide wafer 10 is processed. Thus, the silicon carbide wafers 10 that will be products can be less damaged than the dummy silicon carbide wafer 10. Therefore, in the silicon carbide semiconductor device 1 that will be a product, damage to the interface between the silicon carbide wafer 10 and the metal layer 13, which may be caused by the sputtering, can be reduced.

To replace one of the plurality of silicon carbide wafers 10 with another, for example, in a state where the high-frequency voltage is applied between the pair of electrodes 21 and 22, the silicon carbide wafer 10 on which the metal film has been formed is replaced with the silicon carbide wafer 10 on which the metal film is not yet formed. In this case, it is not necessary to newly ignite the plasma after the silicon carbide wafer 10 is replaced. Therefore, damage to the silicon carbide wafer 10 can be reduced.

Alternatively, the replacement of the silicon carbide wafer 10 on which the metal film has been formed with the silicon carbide wafer 10 on which the metal film is not yet formed may be performed in a state where the sputtering gas is flowed into the chamber 25, instead of the state where the high-frequency voltage is applied between the pair of electrodes 21 and 22. This exerts the same effects as those obtained when the replacement is performed in the state where the high-frequency voltage is applied between the pair of electrodes 21 and 22. To be specific, since it is not necessary to newly ignite the plasma again after the silicon carbide wafer 10 is replaced, damage to the silicon carbide wafer 10 can be reduced.

In the preferred embodiments described above, an inert gas, and more specifically Ar that is a rare gas, is adopted as the sputtering gas. However, this is not limiting, and another rare gas, such as helium (He), neon (Ne), krypton (Kr), or xenon (Xe), is adoptable. For example, one or more kinds of these rare gases are adopted as the sputtering gas.

In a case where a rare gas is adopted as the sputtering gas, it is preferable to change the rare gas from a rare gas having a small mass to a rare gas having a large mass during the formation of the metal film. In other words, it is preferable to form the metal film while changing the sputtering gas from a rare gas having a small mass to a rare gas having a large mass. In this case, for example, the sputtering gases are switched over in the order of He, Ne, Ar, Kr, and Xe.

This can reduce a collision energy of collision of the sputtering gas with the silicon carbide wafer 10 at the plasma ignition time in which damage is likely to occur. Therefore, damage to the silicon carbide wafer 10 caused by the sputtering gas can be reduced.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide semiconductor device, said method comprising a metal film formation step of forming a metal film by: in a chamber suctioned by a vacuum pump, causing a high-frequency voltage to be applied between a pair of electrodes including an anode and a cathode that are arranged opposed to each other, to thereby cause a plasma of a sputtering gas to be generated between said pair of electrodes; sputtering a metal material placed on said cathode with an ion in said generated plasma; and causing said sputtered metal material to be deposited on a silicon carbide wafer that is placed on said anode so as to be opposed to said metal material, wherein, in said metal film formation step, said metal film is formed under a condition that an incident energy of incidence of said metal material and said sputtering gas on said silicon carbide wafer is lower than a binding energy of silicon carbide.

2. The method of manufacturing a silicon carbide semiconductor device according to claim 1, wherein
in said metal film formation step, the condition that said incident energy is lower than said binding energy of silicon carbide, under which said metal film is formed, is satisfied by setting said high-frequency voltage applied between said pair of electrodes to be equal to or higher than 20V and equal to or lower than 300V.

3. The method of manufacturing a silicon carbide semiconductor device according to claim 2, wherein
in said metal film formation step, until a predefined low-voltage film formation period elapses from a time point at which the plasma is ignited to said sputtering gas, said metal film is formed while said high-frequency voltage applied between said pair of electrodes is set to be equal to or higher than 20V and equal to or lower than 300V, and after said low-voltage film formation period elapses, said high-frequency voltage applied between said pair of electrodes is increased to above 300V and said metal film is formed.

4. The method of manufacturing a silicon carbide semiconductor device according to claim 1, wherein
in said metal film formation step, the condition that said incident energy is lower than said binding energy of silicon carbide, under which said metal film is formed, is satisfied by setting a distance between said pair of electrodes to be equal to or larger than 0.1 m.

5. The method of manufacturing a silicon carbide semiconductor device according to claim 4, wherein
in said metal film formation step, until a predefined long-distance film formation period elapses from a time point at which the plasma is ignited to said sputtering gas, said metal film is formed while the distance between said pair of electrodes is set to be equal to or larger than 0.1 m, and after said long-distance film formation period elapses, the distance between said pair of electrodes is set to be less than 0.1 m and said metal film is formed.

6. The method of manufacturing a silicon carbide semiconductor device according to claim 1, wherein
in said metal film formation step, the condition that said incident energy is lower than said binding energy of silicon carbide, under which said metal film is formed, is satisfied by setting a flow rate of said sputtering gas to be lower than 10 sccm.

7. The method of manufacturing a silicon carbide semiconductor device according to claim 6, wherein
in said metal film formation step, until a predefined low-flow-rate film formation period elapses from a time point at which the plasma is ignited to said sputtering gas, said metal film is formed while the flow rate of said sputtering gas is set to be lower than 10 sccm, and after said low-flow-rate film formation period elapses, the flow rate of said sputtering gas is set to be equal to or higher than 10 sccm and said metal film is formed.

8. The method of manufacturing a silicon carbide semiconductor device according to claim 1, wherein
in said metal film formation step, while said metal films are sequentially formed on the plurality of said silicon carbide wafers, said silicon carbide wafer on which said metal film has been formed is replaced with said silicon carbide wafer on which said metal film is not yet formed in a state where said high-frequency voltage is applied between said pair of electrodes.

9. The method of manufacturing a silicon carbide semiconductor device according to claim 1, wherein
in said metal film formation step, while said metal films are sequentially formed on the plurality of said silicon carbide wafers, said silicon carbide wafer on which said metal film has been formed is replaced with said silicon carbide wafer on which said metal film is not yet formed in a state where said sputtering gas is flowed into said chamber.

10. The method of manufacturing a silicon carbide semiconductor device according to claim 1, wherein
in said metal film formation step, the plasma is ignited to said sputtering gas in a closed state where a shutter is placed between said pair of electrodes so as to cover said silicon carbide wafer, and after a predefined closing period elapses from a time point at which the plasma is ignited to said sputtering gas, an open state is made where said shutter is retracted from a position at which said shutter covers said silicon carbide wafer, and said metal film is formed.

11. The method of manufacturing a silicon carbide semiconductor device according to claim 1, wherein
in said metal film formation step, a collimator is placed between said pair of electrodes, and the plasma is ignited to said sputtering gas in a state where an angle of a regulating plate included in said collimator relative to a reference line connecting said anode and said cathode included in said pair of electrodes to each other is set to be 90°, and then the angle of said regulating plate relative to said reference line is set to be equal to or more than 0° and less than 90°, and said metal film is formed.

12. The method of manufacturing a silicon carbide semiconductor device according to claim 1, comprising, after said metal film formation step, a step of performing a heat treatment on said silicon carbide wafer having said metal film formed thereon at a crystal recovery temperature of said metal material.

13. The method of manufacturing a silicon carbide semiconductor device according to claim 1, wherein the silicon carbide semiconductor device is a Schottky barrier diode.

14. A method of manufacturing a silicon carbide semiconductor device, said method comprising a metal film formation step of forming a metal film by: in a chamber suctioned by a vacuum pump, causing a high-frequency voltage to be applied between a pair of electrodes including an anode and a cathode that are arranged opposed to each other, to thereby cause a plasma of a sputtering gas to be generated between said pair of electrodes; sputtering a metal material placed on said cathode with an ion in said generated plasma; and causing said sputtered metal material to be deposited on a silicon carbide wafer that is placed on said anode so as to be opposed to said metal material, wherein
in said metal film formation step, said metal film is formed under a condition that an incident energy of incidence of said metal material and said sputtering gas on said silicon carbide wafer is lower than a binding energy of silicon carbide,
in said metal film formation step, the condition that said incident energy is lower than said binding energy of silicon carbide, under which said metal film is formed, is satisfied by setting said high-frequency voltage applied between said pair of electrodes to be equal to or higher than 20V and equal to or lower than 300V,
in said metal film formation step, said metal films are sequentially formed on a plurality of said silicon carbide wafers while said high-frequency voltage applied between said pair of electrodes is set to be equal to or higher than 20V and equal to or lower than 300V, and among the plurality of said silicon carbide wafers on which said metal films have been formed, the silicon carbide wafer on which said metal film has been firstly formed is excluded, and the silicon carbide wafers on which said metal films have been secondly and subsequently formed are used to manufacture the silicon carbide semiconductor device.

15. A method of manufacturing a silicon carbide semiconductor device, said method comprising a metal film formation step of forming a metal film by: in a chamber suctioned by a vacuum pump, causing a high-frequency voltage to be applied between a pair of electrodes including an anode and a cathode that are arranged opposed to each other, to thereby cause a plasma of a sputtering gas to be generated between said pair of electrodes; sputtering a metal material placed on said cathode with an ion in said generated plasma; and causing said sputtered metal material to be deposited on a silicon carbide wafer that is placed on said anode so as to be opposed to said metal material, wherein in said metal film formation step, said metal film is formed under a condition that an incident energy of incidence of said metal material and said sputtering gas on said silicon carbide wafer is lower than a binding energy of silicon carbide, in said metal film formation step, the condition that said incident energy is lower than said binding energy of silicon carbide, under which said metal film is formed, is satisfied by setting said high-frequency voltage applied between said pair of electrodes to be equal to or higher than 20V and equal to or lower than 300V, and in said metal film formation step, a magnet is placed at a side opposite to said metal material across said cathode, and the plasma is ignited to said sputtering gas in a state where a magnetic force of said magnet is deactivated, and after a predefined demagnetizing period elapses from a time point at which the plasma is ignited to said sputtering gas, a magnetic force is caused in said magnet, and said metal film is formed.

16. A method of manufacturing a silicon carbide semiconductor device, said method comprising a metal film formation step of forming a metal film by: in a chamber suctioned by a vacuum pump, causing a high-frequency voltage to be applied between a pair of electrodes including an anode and a cathode that are arranged opposed to each other, to thereby cause a plasma of a sputtering gas to be generated between said pair of electrodes; sputtering a metal material placed on said cathode with an ion in said generated plasma; and causing said sputtered metal material to be deposited on a silicon carbide wafer that is placed on said anode so as to be opposed to said metal material, wherein in said metal film formation step, said metal film is formed under a condition that an incident energy of incidence of said metal material and said sputtering gas on said silicon carbide wafer is lower than a binding energy of silicon carbide, in said metal film formation step, the condition that said incident energy is lower than said binding energy of silicon carbide, under which said metal film is formed, is satisfied by setting said high-frequency voltage applied between said pair of electrodes to be equal to or higher than 20V and equal to or lower than 300V, in said metal film formation step, said metal film is formed while said sputtering gas is changed from a rare gas having a small mass to a rare gas having a large mass.

* * * * *